United States Patent
Shkolnik et al.

(10) Patent No.: US 7,962,238 B2
(45) Date of Patent: Jun. 14, 2011

(54) PROCESS FOR THE PRODUCTION OF A THREE-DIMENSIONAL OBJECT WITH RESOLUTION IMPROVEMENT BY PIXEL-SHIFT

(75) Inventors: Alexandr Shkolnik, Los Angeles, CA (US); Hendrik John, Hunxe (DE); Ali El-Siblani, Dearborn Heights, MI (US)

(73) Assignee: Envisiontec GmbH, Gladbeck (DE)

( * ) Notice: Subject to any disclaimer, the term of this patent is extended or adjusted under 35 U.S.C. 154(b) by 0 days.

(21) Appl. No.: 12/847,556

(22) Filed: Jul. 30, 2010

(65) Prior Publication Data

US 2011/0009992 A1 Jan. 13, 2011

Related U.S. Application Data

(62) Division of application No. 11/126,068, filed on May 9, 2005, now Pat. No. 7,790,093.

(30) Foreign Application Priority Data

May 10, 2004 (DE) .......................... 10 2004 022 961

(51) Int. Cl.
*G06F 19/00* (2011.01)
(52) U.S. Cl. ......... 700/119; 264/401; 700/118; 700/124
(58) Field of Classification Search .................. 700/118, 700/119, 124; 264/401
See application file for complete search history.

(56) References Cited

U.S. PATENT DOCUMENTS

| | | | | |
|---|---|---|---|---|
| 5,130,064 A | * | 7/1992 | Smalley et al. | 264/401 |
| 5,454,069 A | | 9/1995 | Knapp et al. | |
| 5,506,607 A | * | 4/1996 | Sanders et al. | 347/1 |
| 5,510,066 A | * | 4/1996 | Fink et al. | 264/40.1 |
| 5,894,036 A | * | 4/1999 | Tylko | 427/279 |
| 5,900,207 A | * | 5/1999 | Danforth et al. | 264/603 |
| 6,001,297 A | * | 12/1999 | Partanen et al. | 264/401 |
| 6,215,095 B1 | * | 4/2001 | Partanen et al. | 219/121.62 |
| 6,399,010 B1 | * | 6/2002 | Guertin et al. | 264/401 |

(Continued)

FOREIGN PATENT DOCUMENTS

JP  2002210834  7/2002

OTHER PUBLICATIONS

"Rigorous Simulation of 3D Masks", Burger et al, Zuse Institute Berlin, Oct. 24, 2006.*

(Continued)

*Primary Examiner* — Michael D Masinick
(74) *Attorney, Agent, or Firm* — Hansen IP Law PLLC

(57) ABSTRACT

The invention relates to a process or device for the production of a three-dimensional object by layer-wise solidification of a material which is solidifiable under the application of electromagnetic irradiation by means of mask illumination, wherein the mask is produced using an image forming unit having a prescribed resolution, which is formed from a constant number of image forming elements (pixels) being discrete and being arranged in a spatially mutually fixed manner. For the improvement of the resolution along the outer and inner contours of the sectional areas of the object to be generated layer-wise in the sub-pixel range, a multiple illumination per layer is performed, which consists of a series of multiple images that are mutually shifted in the sub-pixel range in the image/construction plane, wherein a separate mask/bitmap is produced for each shifted image.

9 Claims, 7 Drawing Sheets

U.S. PATENT DOCUMENTS

| | | | | |
|---|---|---|---|---|
| 6,500,378 B1 * | 12/2002 | Smith | | 264/401 |
| 6,833,231 B2 * | 12/2004 | Moussa et al. | | 430/280.1 |
| 6,833,234 B1 * | 12/2004 | Bloomstein et al. | | 430/321 |
| 7,636,610 B2 * | 12/2009 | Schillen et al. | | 700/119 |
| 7,758,799 B2 | 7/2010 | Hull et al. | | |
| 7,790,093 B2 * | 9/2010 | Shkolnik et al. | | 264/401 |
| 7,831,328 B2 * | 11/2010 | Schillen et al. | | 700/119 |
| 2005/0248061 A1 * | 11/2005 | Shkolnik et al. | | 264/401 |

OTHER PUBLICATIONS

Zhenhai Zhu; , "A parameterized mask model for lithography simulation," Design Automation Conference, 2009. DAC '09. 46th ACM/IEEE , vol., no., pp. 963-968, Jul. 26-31, 2009.*

* cited by examiner

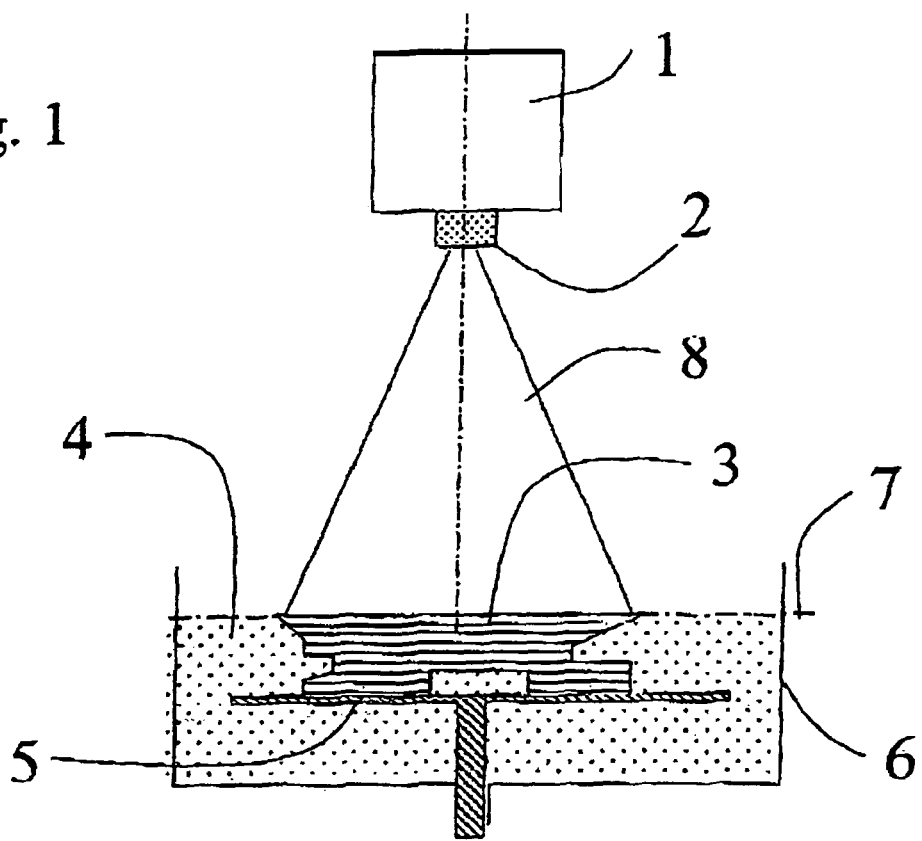
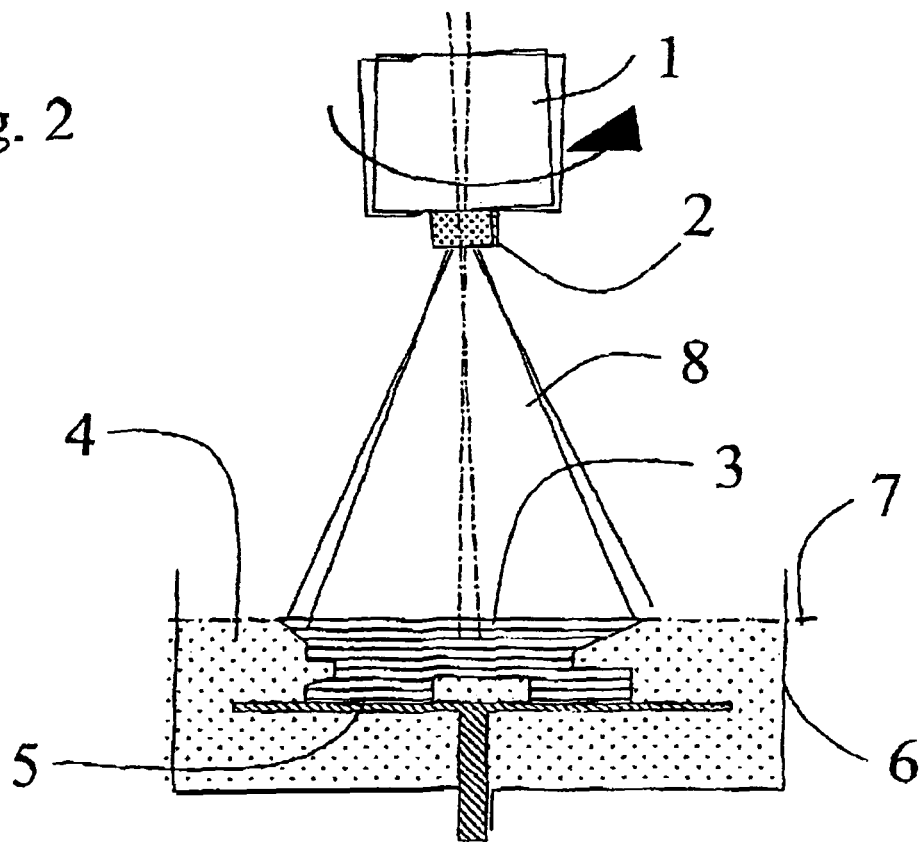

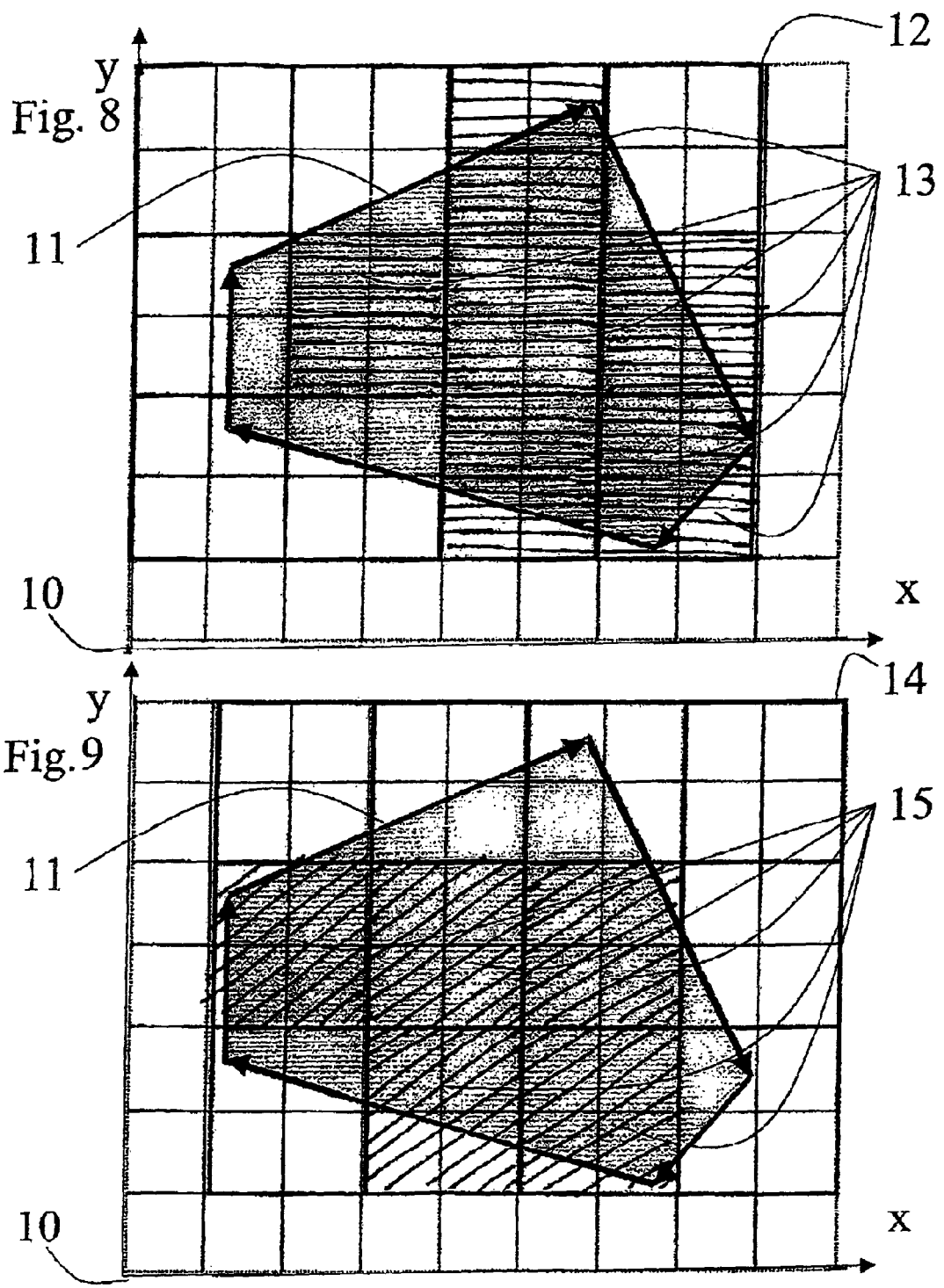

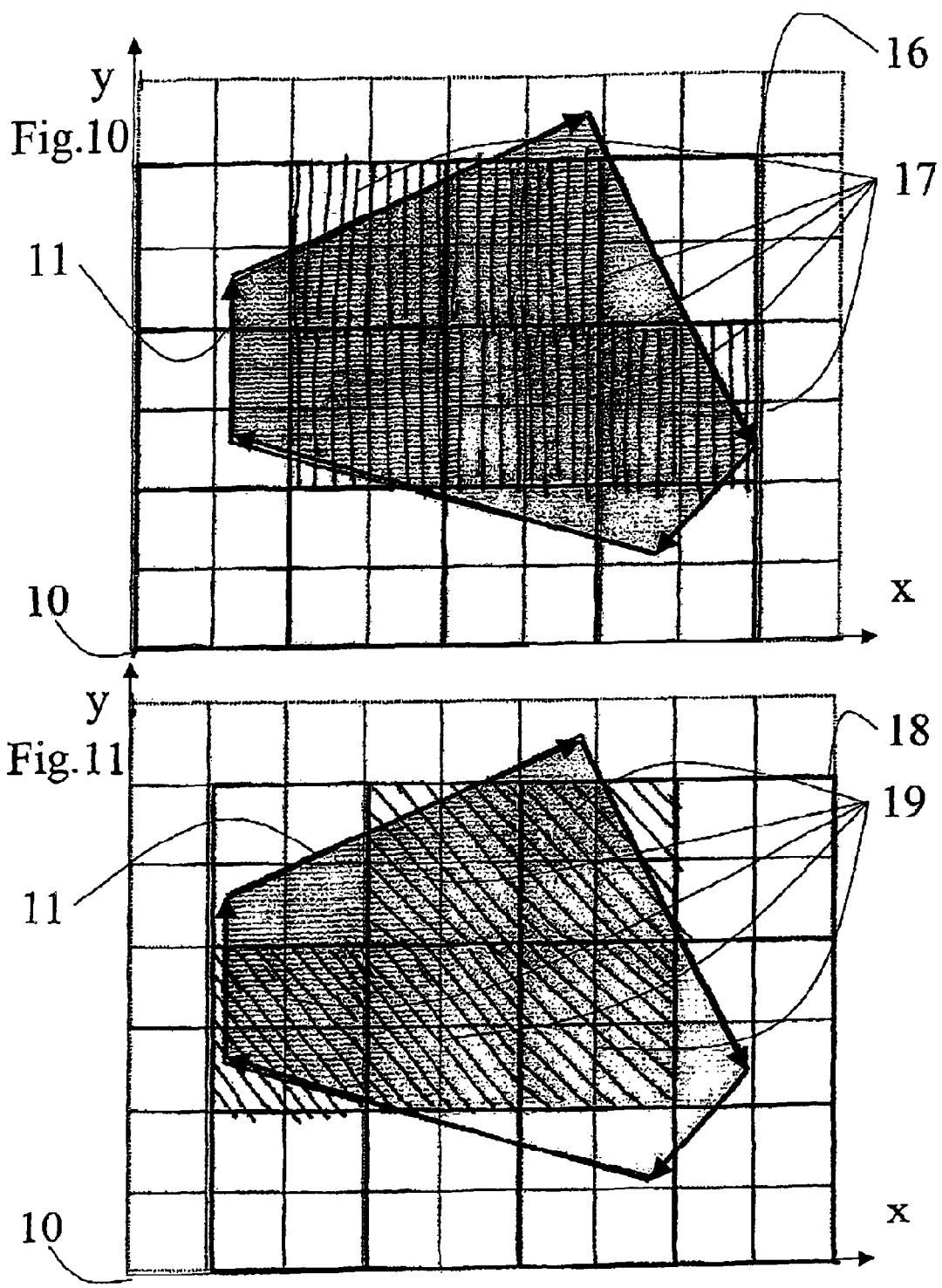

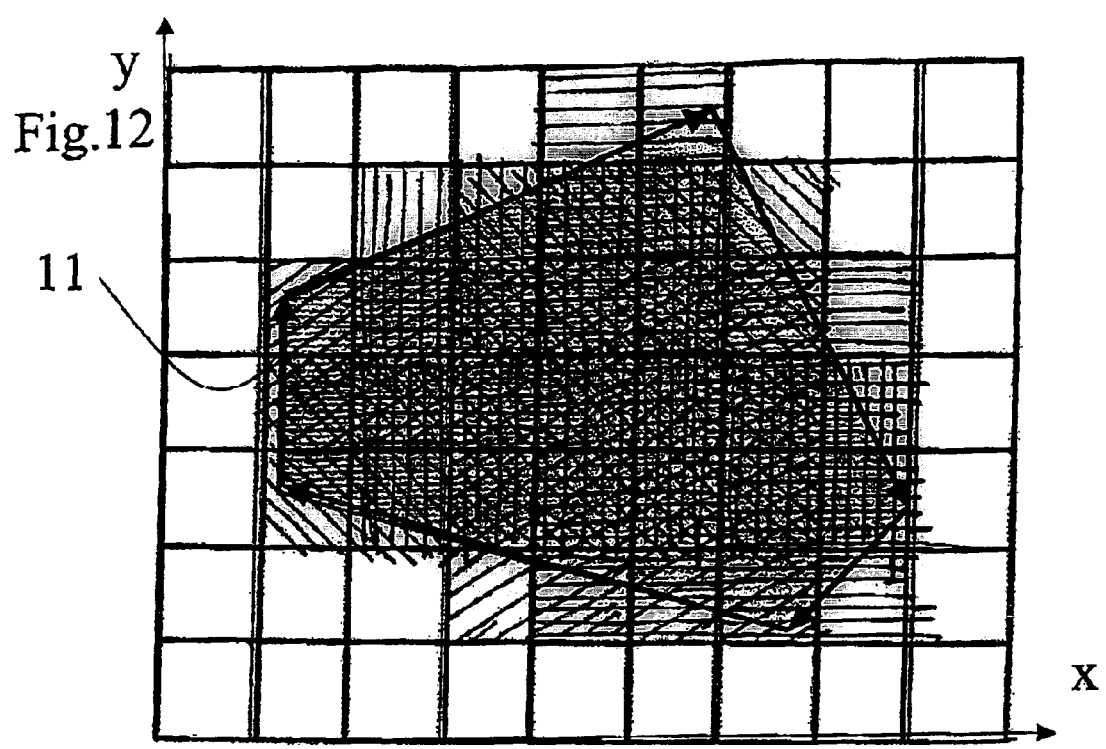

PROCESS FOR THE PRODUCTION OF A THREE-DIMENSIONAL OBJECT WITH RESOLUTION IMPROVEMENT BY PIXEL-SHIFT

CROSS-REFERENCE TO RELATED APPLICATIONS

This application is a Divisional of U.S. patent application Ser. No. 11/126,068, filed May 9, 2005 now U.S. Pat. No. 7,790,093, the entirety of which is hereby incorporated by reference.

TECHNICAL FIELD

The invention related to a process and a device for the production of a three-dimensional object by layer-wise solidification of a photohardening material by mask illumination by means of a rastered image forming unit having constant resolution, wherein the resolution within the image/construction plane shall be improved in the sub-pixel range.

BACKGROUND ART

For the layer-wise construction of three-dimensional objects from "lighthardening" materials, various processes are mentioned in literature, see in this respect "Automated Fabrication-Improving Productivity in Manufacturing" of Marshall Burns, 1993 (ISBN 0-13-119462-3).

This invention relates to processes wherein the layer to be generated is based on illumination by means of a rastered mask, wherein the smallest physical resolution within the mask is provided by the size of a pixel.

Known possibilities presently are, inter alia, illumination by
  a) Projection unit (on the basis of DLP®/DMD®, LCD, ILA®, etc.)
  b) LD-display (reflective, transmissive)
  c) LED-, or laser-diode-line/-matrix (which is moved in XY-plane over the layer)
  d) Line or matrix (which is moved in XY-plane over the layer) based on MEM-technology (light-valve).

Some of these methods are described in the following patents:

IPC: B29C67/00 "Rapid Prototyping apparatus and method of Rapid Prototyping" of Dicon AS (DK), (application)

U.S. Pat. No. 5,247,180 A "Stereolithographic Apparatus and Method of use" of Texas Instruments Inc., September 1993.

U.S. Pat. No. 5,980,813 A "Rapid Prototyping using multiple materials" of SRI International, November, 1999;

Utility Model DE G 93 19 405.6 "Device for the production of a three-dimensional object (model) according to the principle of photosolidification" of Research Center Informatik at the University Karlsruhe, Dez. 1993;

An application for the generation of micro-technical, three-dimensional construction parts according to a similar process is described in the Utility Model DE 299 11 122 U1 "Device for the production of a three-dimensional object" DeltaMed et al., June 1999.

PCT Application 02 008 019.8 "Device for the production of a three-dimensional object" of Envision Technologies GmbH, April 2002.

U.S. Pat. No. 6,180,050 describes a linear scan technique for layer-wise solidification in the production of three-dimensional objects. The resolution is enhanced by scanning, in X-direction, an illumination head having an array of optical fibers, which are displaced in the Y-direction.

DRAWBACKS OF THE PRIOR ART

With all of the above described processes, the resolution of the material layer to be hardened is in direct dependency from the resolution of an image forming process.

With the projection processes, an intermediary positioned optic additionally determines the scale of the projected or solidifiable layer.

The resolution per area unit in the image/construction plane thus is dependent on a) the resolution of the image forming unit or the smallest element, called pixel, and their relative mutual distances, called pixel-pitch, and b) the projection scale.

The surface roughness of the construction part thus is determined by the smallest volume unit of one voxel (volume-pixel), the size of which is composed of the projected pixel area in XY and the layer thickness in Z. The resolution of the layer thickness is prescribed by the smallest resolution (step level) of the actuator in Z, in order to move the support platform. Resolutions already down to the one-figure μm range is achievable hereby. If an even lower surface roughness of the construction part shall be realized, the projection field and concurrently the width of the pixel area must be down-sized.

As an example, the projection m.H. of a multi-media projector shall be mentioned here; with a resolution of XGA (1024×768 image dots), a pixel of 17 μm and pixel-pitch of 17.9 μm one realizes, at a projection to 275 mm×206 mm with an enhancement factor of the projection optic of 15, a resolution in the image/construction plane and thus in the layer to be solidified of approximately 100 dpi, which corresponds to a pixel size in the projection plane of about 0.254 mm×0.254 mm.

In order to e.g. double the resolution in the image-/construction plane, while maintaining the same construction area, it is proposed in the projection processes to half the projection/enhancement factor (which means to quarter the area) and, for the illumination of the four partial planes, to shift either the whole projection unit or the construction space mutually in parallel.

This process has the significant drawback that relatively high masses have to be moved towards each other very precisely in order to ensure an exact abutment and a close connection of the partial planes, which means a considerable expenditure of costs and additional need of space in the whole arrangement for the mechanics required therefore.

With the selective direct illumination by scanning m.H. of a LED- or laser-diode-line/-matrix or direct illumination by a mask, which is formed by a transmissive LCD, the resolution in the construction plane is equivalent to the resolution in the image forming unit.

Object of the Invention

It is an object of the invention to provide a process or a device which can enhance the resolution in the construction plane, while maintaining the same large construction area, many times in the sub-pixel range, i.e. to refine the rastering of the outer and inner contours in the sectional planes of the object, a) without having to carry out an illumination in partial areas to be composed together, and
b) without enhancing the resolution of the rastered image-forming unit itself.

Solution of the Object

The present invention provides a process for the production of a three-dimensional object by layer-wise solidification of a material solidifiable by the action of electromagnetic irradiation by means of mask illumination, wherein the mask is produced by an image forming unit having a prescribed resolution, which mask is formed from a constant number of image forming elements (pixel) being discrete and spatially arranged in a fixed manner to each other, characterized in that, for improving the resolution in the sub-pixel range along the outer and inner contours of the sectional areas of the object to be generated layer-wise, a multiple illumination is carried out for each layer which consists of a sequence of a multitude of images mutually shifted in the sub-pixel range in the image/construction plane, wherein a separate mask/bitmap is produced for each shifted image.

The invention also provides a device for the production of a three-dimensional object by layer-wise solidification of a material which is solidifiable under the application of electromagnetic irradiation by means of mask illumination, whereby the irradiation necessary for hardening is imaged into the image/construction plane, wherein the device comprises a rastered, image forming unit for the selective illumination, which is embodied either by line or by matrix, characterized in that the image forming unit composes the image from individual image dots (pixels) and thus forms a rastered mask (bitmap), wherein the pixels are arranged within the plane in a manner mutually fixed to each other, and that the image forming unit and/or an imaging optic which is provided between the image forming unit and the image/construction plane is/are designed such that a sequence of a multitude of images, which are mutually shifted in a sub-pixel range, can be created, wherein a separate mask/bitmap can be produced for each shifted image.

Preferred embodiments of the process of the present invention include one or more of the following features:
(a) said image forming unit is formed of a constant number of image forming elements (pixel) being discrete and spatially arranged to each other in a two-dimensional matrix;
(b) a sequence of at least 2 images mutually shifted in the sub-pixel range is carried out in the image/construction plane, corresponding to the resolution of the image forming unit and under consideration of the corresponding sub-pixel shift;
(c) the sectional area, i.e. outer and inner contours, are defined by vectorial trails which are superimposed by technical image processing by a rastered area (bitmap), the resolution of which exactly corresponds to the resolution of the discrete elements (pixels) in the image forming unit and thus in the image in the construction plane, wherein the superimposition of vectorial trails and bitmap takes place in a superior-ordered XY-coordinate system, and wherein the active pixels are calculated by a specific algorithm in order to define the sectional area in the form of a rastered mask;
(d) the mask generation (bitmapping) of each sectional area of a three-dimensional object is carried out in the starting position and in various states displaced (shifted) in the sub-pixel range in XY, and that a total image having an enhanced resolution in the contour portion corresponding to the pixel shift is obtained by the superimposition of these bitmaps per sectional area;
(e) a bitmap is produced which is shifted relative to the sectional area by delta X, which results in a new distribution of active pixels;
(f) a bitmap is produced which is shifted by delta Y in the sub-pixel range relatively to the sectional area, which results in a new distribution of active pixels;
(g) a bitmap is produced which is shifted along the pixel diagonal by delta X and delta Y relatively to the sectional area, which results in a new distribution of active pixels;
(h) the total illumination of an individual layer results from the partial illuminations of the masks/bitmaps shifted in the sub-pixel range;
(i) for each layer of the object, a multitude of masks or bitmaps having different sub-pixel shifts in XY can be generated and can be illuminated serially for each layer to be hardened;
(j) a simplified process for resolution improvement is achieved in a manner that only the bitmap of the starting position and the bitmap of the diagonal-shift by a half pixel-diagonal are produced and are subsequently illuminated for each layer to be hardened;
(k) for the shifted imaging of the rastered masks/bitmaps in the construction plane which are produced in a shifted manner in the sub-pixel range for the purpose of selectively hardening the material layer, the image forming unit is tilted for each shifted bitmap such that the desired shift of the image in the sub-pixel range image/construction plane is achieved;
(l) for the shifted imaging of the rastered masks/bitmaps in the construction plane which are produced in a shifted manner in the sub-pixel range for the purpose of selectively hardening the material layer, the image forming unit for each shifted bitmap is shifted by the corresponding sub-pixel range in X and Y, that is parallel in plane to the image/construction plane;
(m) for the shifted imaging of the rastered masks/bitmaps in the construction plane which are produced in a shifted manner in the sub-pixel range for the purpose of selectively hardening the material layer, the image forming projection unit is maintained fixed in its position, and the imaging optic of the projection unit is tilted for each shifted bitmap such that the desired shift of the image in the image/construction plane in the sub-pixel range is achieved;
(n) for the shifted imaging of the rastered masks/bitmaps in the construction plane which are produced in a shifted manner in the sub-pixel range for the purpose of selectively hardening the material layer, the image forming projection unit is maintained fixed in its position, and the imaging optic of the projection unit is shifted for each shifted bitmap in XY such that the desired shift of the image in the image/construction plane in the sub-pixel range is achieved;
(o) for the shifted imaging of the rastered masks/bitmaps in the construction plane which are produced in a shifted manner in the sub-pixel range for the purpose of selectively hardening the material layer, the projection unit is tilted for each bitmap via actuators such that the projected image in the construction plane is shifted in the corresponding sub-pixel range in X and Y;
(p) for the shifted imaging of the rastered masks/bitmaps in the construction plane which are produced in a shifted manner in the sub-pixel range for the purpose of selectively hardening the material layer, a cardanic mounted transparent, plane-parallel plate is arranged between the projection unit and the image/construction plane, which plate shifts, by rotation around two axis (XY) which are present in-plane parallel to the image/construction plane, the projection beam path and thus the image in the image/construction plane in the sub-pixel range in X and Y;

(q) for the shifted imaging of the rastered masks/bitmaps in the construction plane which are produced in a shifted manner in the sub-pixel range for the purpose of selectively hardening of the material layer, a transparent plane-parallel plate is arranged between the projection unit and the image/construction plane, which plate shifts, by rotation around an axis parallel to a pixel-diagonal, the projection beam path and thus the image in the image/construction plane in the sub-pixel range along the pixel diagonal which is orthogonal thereto;

(r) for the shifted imaging of the rastered masks/bitmaps in the construction plane which are produced in a shifted manner in the sub-pixel range for the purpose of selectively hardening of the material layer, the projection unit is maintained fixed in its position, and to projection beam is deflected via a mirror into the image/construction plane, wherein the deflecting mirror is provided with an adjustment possibility (cardanic support) by which the projection beam for each shifted bitmap can be deflected such that a shift of the image in the sub-pixel range is achieved in the image/construction plane; and (s) the projected light output for each pixel is varied by "grey scaling" within a projection mask, in order to selectively influence the hardening level in a layer thereby and thus to raise the light output of the contour-pixel relative to the light output of the area-pixel, in order to compensate the partial illumination due to partial superimposition of a contour-pixel by the sub-pixel shift of the individual bitmap in the contour portion.

Preferred embodiments of the device of the present invention include one or more of the following features:

(1) said image forming unit for the selective illumination is embodied by a matrix;

(2) a series of at least 2 images, which are mutually shifted in a sub-pixel range, can be created in the image/construction plane (3) said image forming unit is a projection unit;

(4) said image forming unit is a line, particularly a matrix having discretely emitting elements for image formation;

(5) the device is provided with actuators in order to shift the whole image forming unit per partial image in a plane-parallel manner towards the image/construction plane in XY in the sub-pixel range;

(6) the device is provided with actuators which can tilt the image forming unit per shift-generated bitmap such that the individual, shift-generated bitmaps in the image/construction plane are imaged in a manner shifted in the sub-pixel range;

(7) between the image forming unit and the image/construction plane, a mirror is arranged as an imaging optic and is cardanically mounted and is rotatable via actuators such that the beam path is deflected into the image plane and that the individual, shift-generated bitmaps in the image/construction plane can be imaged in a correspondingly shifted manner in the sub-pixel range;

(8) between the image forming unit and the image/construction plane, a transparent plate having mutual plane-parallel surfaces is arranged as an imaging optic and can be tilted by means of one or more actuators such that the beam path is shifted and that the individual, shift-generated bitmaps in the image/construction plane are imaged in a manner shifted in the sub-pixel range;

(9) the image forming projection unit is maintained fixed in its position and that the imaging optic can be shifted in XY in a sub-pixel range of the image forming unit via actuators such that the desired shift of the image in the image/construction plane in a sub-pixel range is achieved; and

(10) the image forming projection unit is maintained fixed in its position and that the imaging optic can be tilted via actuators such that the desired shift of the image in the image/construction plane in the sub-pixel range is achieved.

DESCRIPTION OF THE INVENTION AND ITS ADVANTAGES

By means of the process of the invention or the device of the invention, the resolution in the image/construction plane is improved in the sub-pixel range by means of "pixel-shift".

In particular, the present invention deals with the layer-wise solidification for the production of three-dimensional objects or construction elements by means of solidification of material (specifically by means of photo-polymerization) through mask projection, but not with a conventional layer-wise solidification through (linear) scan technique. This can be carried out according to the invention very efficiently and advantageously by using a two-dimensionally set array as the image generating element, wherein raster and/or resolution is (are) preset, e.g. by means of a set micro mirror array.

Compared to the scan technique, which is called VAROS (Variable Refraction Optical System) by Canon and "Double-CCD" by Epson, the principle of reading and overlapping of images mutually shifted in the sub-pixel range is used in this invention for rastered image forming processes of rapid prototyping.

The resolution or the number of image dots of the rastered, image forming unit itself does not have to be increased in order to realize an improvement in the solution within the construction plane.

For the enhancement of the resolution, the illumination does not occur in correspondingly down-sized, adjacently disposed partial areas, whereby the construction/illumination period for the whole area would be increased by the number of partial areas; rather, the projection/illumination occurs over the whole construction area.

By the measure that an overlapping of images that are mutually shifted in the sub-pixel range takes place, the construction/illumination period of the whole area increases only insubstantially.

The level of resolution improvement within the construction plane can be chosen freely.

BRIEF DESCRIPTION OF THE DRAWINGS

The disclosure will now be described, by way of example, with reference to the accompanying drawings, in which:

FIG. 1 is a schematic view of a device for generating a three-dimensional object by means of mask projection;

FIG. 2 is a schematic view of the device of FIG. 1 in which the image forming unit is tilted to shift a bitmap;

FIG. 8 is a depiction of a bitmap representation of a sectional area of a three-dimensional object with the bitmap in a first position relative to an X-Y coordinate system;

FIG. 9 is a depiction of the bitmap of FIG. 8 in a second position relative to the X-Y coordinate system;

FIG. 10 is a depiction of the bitmap of FIG. 8 in a third position relative to the X-Y coordinate system;

FIG. 11 is a depiction of the bitmap of FIG. 8 in a fourth position relative to the coordinate system; and FIG. 12 is a depiction of the bitmaps of FIGS. 8-11 superimposed on one another on the X-Y coordinate system.

DESCRIPTION OF THE DRAWINGS AND THE PREFERRED EMBODIMENTS OF THE INVENTION

Figure 3:
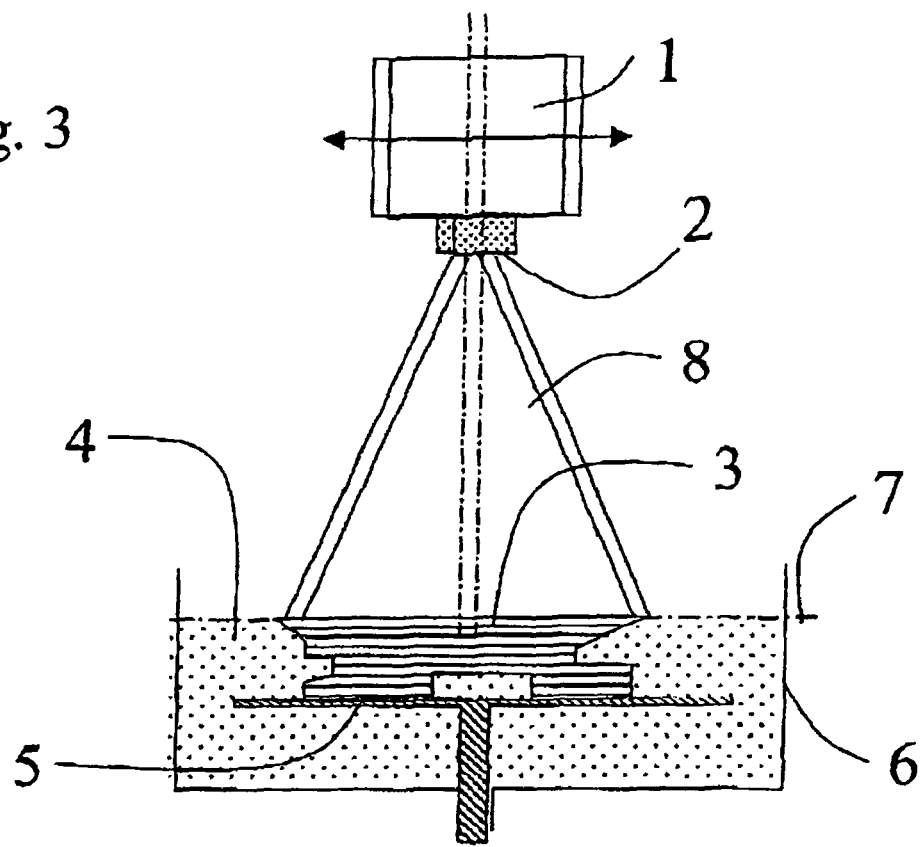
FIG. 3 is a schematic view of the device of FIG. 1 in which the image forming unit is shifted to shift a bitmap.

The present invention will be explained in detail in the following by way of examples and not in a limiting manner by means of drawings.

FIG. 1 schematically shows a basic device for the generation of a three-dimensional object 3 by layer-wise hardening of a photohardening material 4 by means of mask projection 8, wherein the projection unit 1 is present, with an image forming optic 2, above the basin 6 which is filled with photohardening material 4, and wherein the object 3 solidifies layer-wise on a support plate 5, which can be moved within the basin 6 in vertical direction. In a process based on photohardening by means of mask illumination, the irradiation necessary for hardening is projected into the image/construction plane 7. The illumination is carried out by means of a rastered image forming unit, which is formed in the form of a matrix. The image thus is composed of single image dots (pixels) and thus forms a rastered mask (bitmap), wherein the pixels are arranged in a specially fixed manner to each other within the plane.

By a simple example, FIG. 8-12 show the principle of a mask generation (bitmapping) of a sectional area of a three-dimensional object in the starting position (FIG. 8) and in various states of the bitmap which are displaced (shifted) in the sub-pixel range (FIG. 9-11), as well as the overlapping of all bitmaps (FIG. 12).

The sectional area, i.e. the outer and inner contours, are prescribed by a sectorial trail 11, which is superimposed by a rastered area (bitmap) 12, the solution of which exactly corresponds to the resolution of the discrete elements (pixels) within the projected image 8 which is formed by the image forming matrix. Vectorial trail 11 and bitmap 12 thus exist within a superior-ordered XY-coordinate system 10. FIG. 8 shows the bitmap in its starting position. By means of a specific algorithm, the active pixels 13 which describe the sectional area within the bitmap 12 in its starting position are calculated.

In FIG. 9, the bitmap 14 is shifted within the sub-pixel range relative to the sectional area by delta X, whereby a new distribution of active pixels 15 is produced.

FIG. 10 shows a shift of bitmap 16 relative to the sectional area by delta Y with active pixels 17.

FIG. 11 shows a diagonal shift of bitmap 18 relative to the sectional area by delta X and delta Y with active pixels 19.

In FIG. 12, all bitmaps 12, 14, 16 and 18 with their active pixels 13, 15, 17 and 19 are shown superimposed, whereby a resolution improvement in the (outer) contour portion of the sectional area is clearly noticeable.

A simplified process for resolution improvement is achieved by the measure that only bitmap 12 of the started position (FIG. 8) and bitmap 18 of the diagonal shift (FIG. 11) are superimposed. In this case, the bitmap or the image does only have to be shifted in one direction along the diagonal of the pixels.

Depending on the resolution improvement desired for each object layer, a multiple (at least twice) of masks or bitmaps having different sub-pixel shifts can be generated and superimposed.

Figure 4:
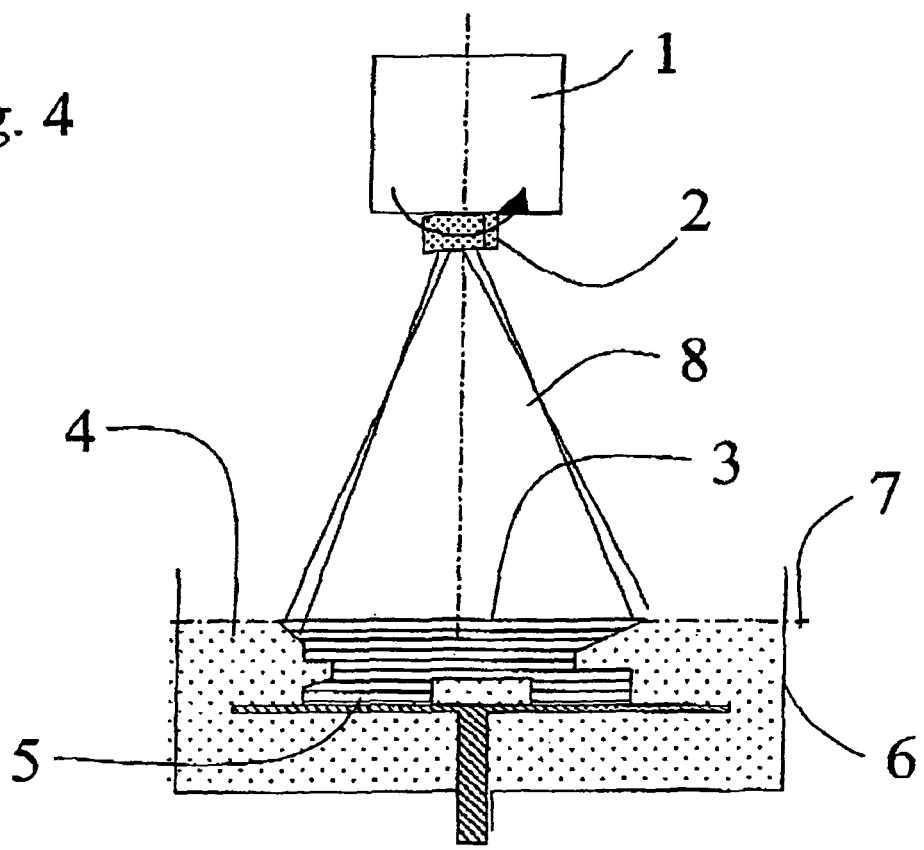
FIG. 4 is schematic view of the device of FIG. 1 in which the imaging optic is tilted to shift a bitmap.
Figure 5:
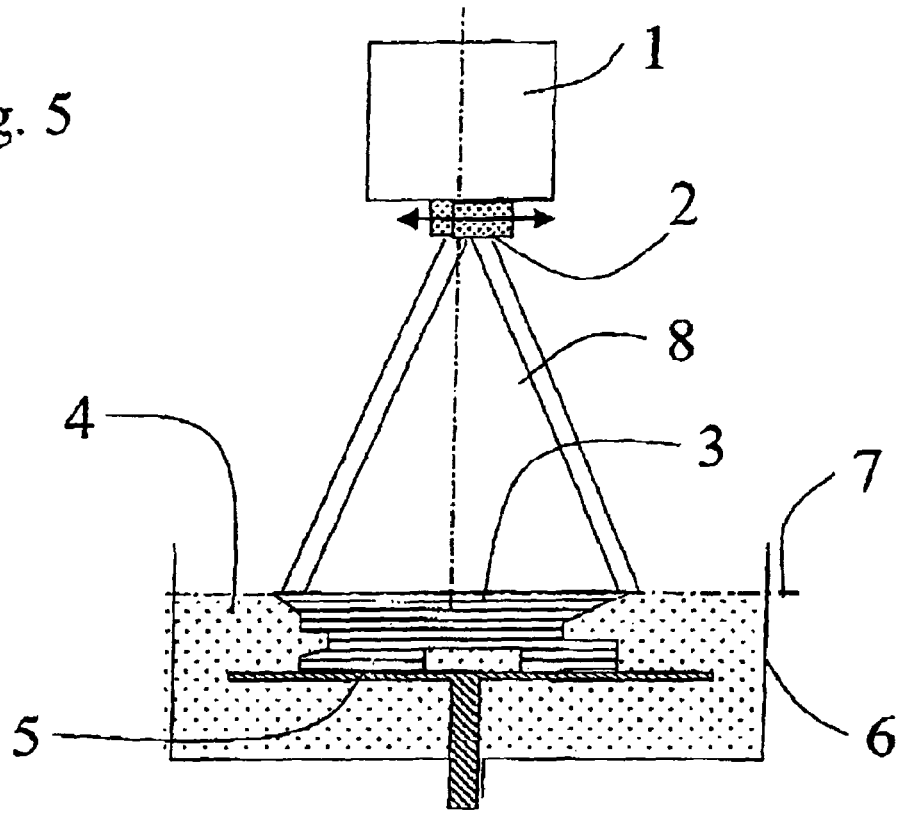
FIG. 5 is a schematic view of the device of FIG. 1 in which the imaging optic is shifted to shift a bitmap.
Figure 6:
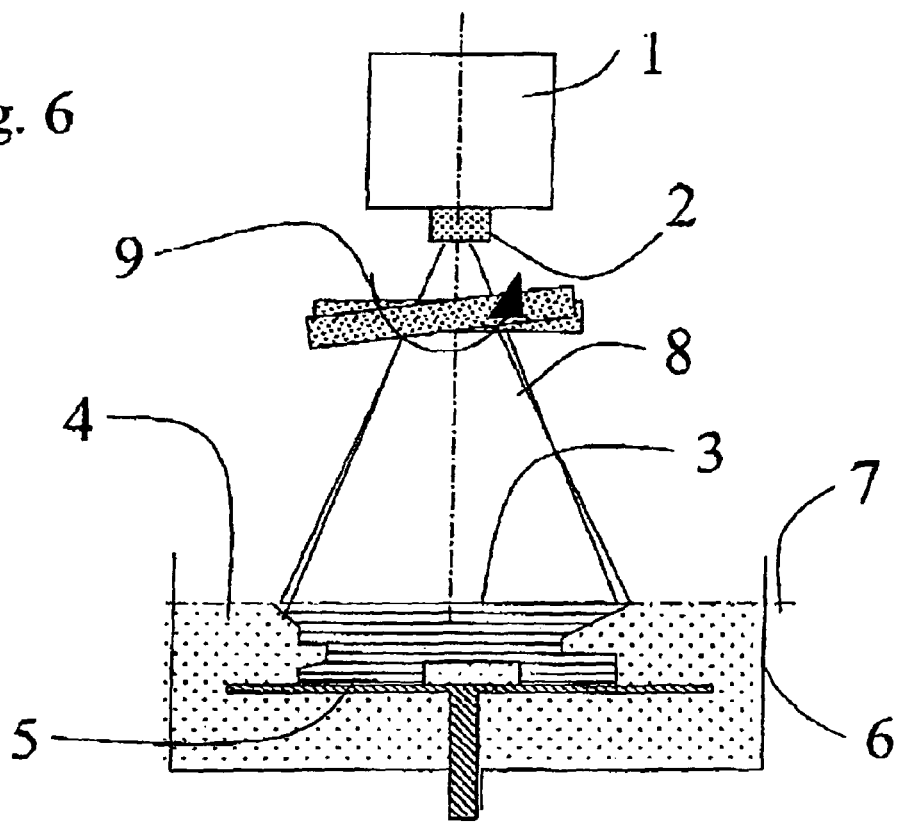
FIG. 6 is a schematic view of the device of FIG. 1 in which a cardanically-mounted, transparent, plane-parallel plate is disposed between the projection unit and the image/construction plane.
Figure 7:
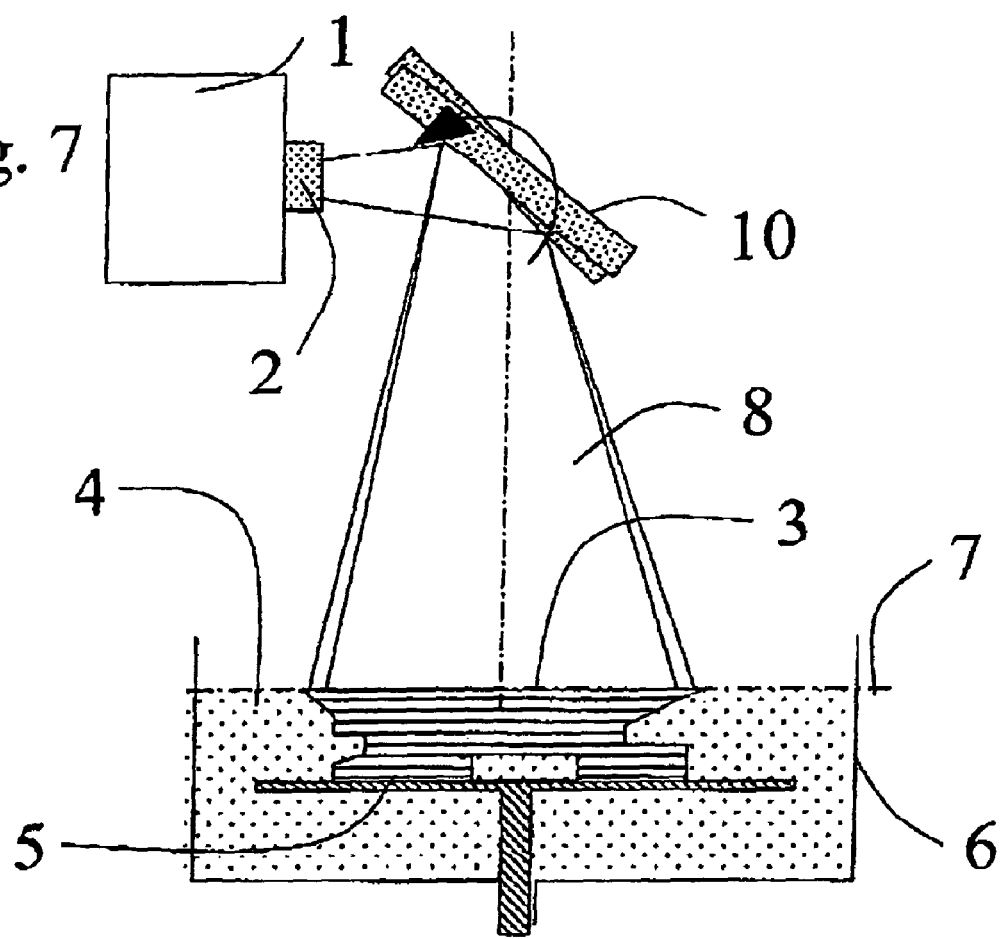
FIG. 7 is a schematic view of a device for generating a three-dimensional object comprising an image forming unit and a tiltable deflecting mirror.

By means of a differently shifted and superimposed illumination of each object/material layer (here by means of bitmaps 12, 14, 16, 18), a resolution improvement in XY in the portion of outer and inner contours is achieved. In order to realize respective sub-pixel shifts in the image within the construction plane, the following various embodiments are described:

1) In FIG. 2, the image forming unit 1 is tilted for each shifted bitmap such that the desired shift of the image in the sub-pixel range within the image/construction plane is achieved.
2) In FIG. 3, the image forming unit 1 is shifted for each shifted bitmap by the corresponding sub-pixel level in X and Y, that is parallel in plane to the image/construction plane, by means of actuators.
3) In FIG. 4, the image forming projection unit is maintained fixed in its position. The imaging optic 2 is tilted for each shifted bitmap such that the desired shift of the image within the image/construction plane in the sub-pixel range is achieved.
4) In FIG. 5, the image forming projection unit is maintained fixed in its position. The imaging optic 2 is moved for each shifted bitmap in XY such that the desired shift of the image within the image-/construction plane in the sub-pixel range is achieved.
5) Particular cases for imaging by image-ward telecentric irradiation path, by an image-ward approximately telecentric irradiation path, and by teleobjectives having long focal length, in order to keep optical errors (angle errors, distortion) small:
   a) In FIG. 5, the projection unit 1 is tilted for each shifted bitmap via actuators such that the projection image 8 within the image/construction plane 7 is shifted in the corresponding sub-pixel range in X and Y.
   b) In FIG. 6, a cardanically mounted transparent, plane-parallel plate 9 (glass plate) is disposed between the protection unit 1 and the image/construction plane 7, which plate shifts the protection irradiation path 8 and thus the image within the image/construction plane 7 in the sub-pixel range in X and Y by means of rotation around two axis (XY), which are located parallel in plane to the image/construction plane.
   c) In FIG. 7, the projection unit 1 is maintained fixed in its position. The projection beam 8 is deflected via a mirror 10 into the image/construction plane 7. The deflecting mirror 10 is provided with an adjustment possibility (cardanic support), by which the protection beam can be deflected for each shifted bitmap such that a shift of the image within the image/construction plane 7 in the sub-pixel range is achieved.

The embodiments 1) to 5) or a) to c) described above can be realized individually or combined with each other.

The bitmaps of each individual layer necessary for mask projection are generated from layer data, in which the outer and inner contours of the respective object section is represented in vectorial trails (as e.g. defined in the data format CLI).

For this, a specific SW is used which carries out the transformation of the vectorial trails into the bitmap format (bit-mapping).

For each sub-pixel shift in XY, a separate bitmap is generated by transforming the XY coordinates of the vectors (for the outer and the inner contours) of the layer data by the respective shift-offset in XY (in the sub-pixel range), and by superposing them over the bitmap-raster, and thus by calculating a new distribution of active pixels for each shift.

The projected light output per pixel can be varied by "grey scaling" within a projection mask, in order to selectively influence the hardening level in one layer thereby. This is particularly meaningful in order to raise the light output of the pixels of the contour because only partial superimposition of the respective pixels of the contour are produced here due to the sub-pixel shift over individual bitmaps (in the areas within the contours a complete superimposition of the pixels of each individual bitmap is ensured).

When projecting/superimposing the section images shifted by sub-pixels, an almost homogeneous distribution of the light output or the illumination intensity can be achieved by means of the superimposition of grey scalings, particularly along the contours of the projected area structure, through the sum of the grey scaling masks.

What is claimed is:

1. A method for generating a bitmap used to guide the projection of electromagnetic radiation from a rastered image forming unit unto the surface of a curable resign, wherein the image forming unit has an image forming matrix, the method comprising:
   defining a coordinate system;
   providing a vector path defining an interior area, wherein the interior area of the vector path corresponds to an inner contour of the object to be formed from the curable resin;
   defining a bitmap comprising a plurality of bitmap grid elements, wherein each bitmap grid element corresponds to a location in the image forming matrix;
   superimposing the bitmap onto the coordinate system to define a first bitmap position relative to the coordinate system;
   superimposing the vector path on the coordinate system;
   calculating a first degree of overlap between each bitmap grid element and the interior area, wherein the first degree of overlap for each grid element corresponds to the area of each bitmap grid element occupied by a portion of the interior area when the bitmap is in the first bitmap position relative to the coordinate system;
   shifting the bitmap to a second bitmap position relative to the coordinate system; and
   calculating a second degree of overlap between each bitmap grid element and the interior area, wherein the second degree of overlap corresponds to the area of each bitmap grid element occupied by a portion of the interior area when the bitmap is in the second bitmap position relative to the coordinate system.

2. The method of claim 1, further comprising projecting electromagnetic radiation onto the curable resin from the image forming unit based on the first degree of overlap and the second degree of overlap for each grid element.

3. The method of claim 1, wherein the step of projecting electromagnetic radiation onto the curable resin comprises first projecting electromagnetic radiation onto the curable resin such that each location in the image forming unit matrix projects electromagnetic radiation having an intensity that corresponds to the first degree of overlap for the bitmap grid element that corresponds to the image forming unit matrix location and second projecting electromagnetic radiation onto the curable resin such that each location in the image forming unit matrix projects electromagnetic radiation having an intensity that corresponds to the second degree of overlap for the bitmap grid element that corresponds to the image forming unit matrix location.

4. The method of claim 1, wherein each grid element has a length and width, and the step of shifting the bitmap to the second position comprises shifting the bitmap from the first bitmap position to the second bitmap position in the direction of the width by a distance that is less than the width and in the direction of the length by a distance that is less than the length.

5. The method of claim 1, wherein each grid element has a length and a width, and the step of shifting the bitmap to the second position comprises shifting the bitmap from the first bitmap position to the second bitmap position in the direction of the width by a distance that is less than the width.

6. The method of claim 1, wherein each grid element has a length and a width, and the step of shifting the bitmap to the second position comprises shifting the bitmap from the first bitmap position to the second bitmap position in the direction of the width by a distance that is less than the width in the direction of the length by a distance that is less than the length.

7. A method for generating a bitmap used to guide the projection of electromagnetic radiation from a rastered image forming unit onto the surface of a curable resin, wherein the image forming unit has an image forming matrix, the method comprising:
   providing a portion of an image of the object to be formed from the curable resin;
   defining a bitmap, wherein the bitmap has a plurality of grid elements and each grid element corresponds to a location in the image forming matrix;
   superimposing the object image on the first bitmap to define a first relative orientation between the object image and the bitmap;
   calculating a first degree of overlap between each grid element and the object image when the bitmap is in the first relative orientation;
   shifting the bitmap relative to the object to define a second relative orientation between the object image and the bitmap; and
   calculating a second degree of overlap between each grid element and the object image when the object image is in the second relative orientation.

8. The method of claim 7, further comprising projecting electromagnetic radiation onto the curable resin based on the first degree of overlap and the second degree of overlap for each grid element.

9. The method of claim 8, wherein the step of projecting electromagnetic radiation onto the curable resin comprises first projecting electromagnetic radiation onto the curable resin such that each location in the image forming unit matrix projects electromagnetic radiation having an intensity that corresponds to the first degree of overlap for the bitmap grid element that corresponds to the image forming unit matrix location and second projecting electromagnetic radiation onto the curable resin such that each location in the image forming unit matrix projects electromagnetic radiation having an intensity that corresponds to the second degree of overlap for the bitmap grid element that corresponds to the image forming unit matrix location.

* * * * *